United States Patent
Matsumoto et al.

(10) Patent No.: US 6,510,544 B1
(45) Date of Patent: Jan. 21, 2003

(54) WIRING DESIGN APPARATUS AND METHOD THEREOF

(75) Inventors: Hiroyuki Matsumoto, Sagamihara (JP); Minoru Katsumata, Machida (JP); Kazuhiko Hirayama, Tokyo-to (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/272,861

(22) Filed: Mar. 19, 1999

(30) Foreign Application Priority Data

Mar. 19, 1998 (JP) .......................................... 10-069677

(51) Int. Cl.[7] .............................................. G06F 17/50
(52) U.S. Cl. ............................. 716/12; 700/87; 716/13; 716/14; 716/12; 703/14
(58) Field of Search ..................... 700/87, 28; 716/12, 716/14, 6, 8, 13, 10; 703/14

(56) References Cited

U.S. PATENT DOCUMENTS

| | | | |
|---|---|---|---|
| 4,484,292 A | * 11/1984 | Hong et al. | 716/13 |
| 4,742,471 A | * 5/1988 | Yoffa et al. | 716/12 |
| 4,782,193 A | * 11/1988 | Linsker | 174/261 |
| 5,124,273 A | * 6/1992 | Minami | 716/14 |
| 5,583,788 A | * 12/1996 | Kuribayashi | 716/14 |
| 5,644,500 A | 7/1997 | Miura et al. | |
| 5,790,414 A | * 8/1998 | Okano et al. | 716/14 |
| 5,872,719 A | * 2/1999 | Miyazaki et al. | 716/12 |
| 5,875,117 A | * 2/1999 | Jones et al. | 716/14 |
| 6,226,560 B1 | * 5/2001 | Hama et al. | 700/87 |
| 6,295,634 B1 | * 9/2001 | Matsumoto | 716/12 |

FOREIGN PATENT DOCUMENTS

JP  5-143689  11/1991

OTHER PUBLICATIONS

"A Continuous Valued Iterative algorithm for Wire routing Problems" Mashiro Nagamatu 1998 Conference on Knowledge Base Systems Apr. 21–23, 1998, IEEE.*
"An Optimal Solution to a Wire Router Problem" Martin Tompa, University of Washington, ACM, 1980.*
"A Method for the Shortest Path Search by Extended Dijkstra Algorithm" Masato Noto, Kanagawa University, Yokohama Japan, IEEE 2000.*
Joseph O'Rourke, "Computational Geometry in C", published 1994. Chapter 8, pp. 270–276.

* cited by examiner

*Primary Examiner*—Kevin J. Teska
*Assistant Examiner*—Fred Ferris
(74) *Attorney, Agent, or Firm*—Ira D. Blecker

(57) ABSTRACT

The wiring design software 3 reads in design information, analyzes it to generate a wiring problem and correlates bonding pads and pins of a semiconductor package to each other (S102, S104). The wiring design software 3 then searches a wiring route while permitting crossing by using the Dijkstra method and the like, calculates an evaluation value by weighting the length of a candidate route with a coefficient W when the candidate route crosses a monitoring side E, and selects a candidate route having a minimum evaluation value as a partial route (S110). Finally, the result of wiring is outputted (S112)

7 Claims, 10 Drawing Sheets

Remarks

○ Sink (or Source) Element

● Wiring Prohibiting Area

—— Side for Monitoring Wiring Density

----▶ Wiring under Searching

CROSS  Crossing of Wiring under Searching and the Side

[Figure 1]
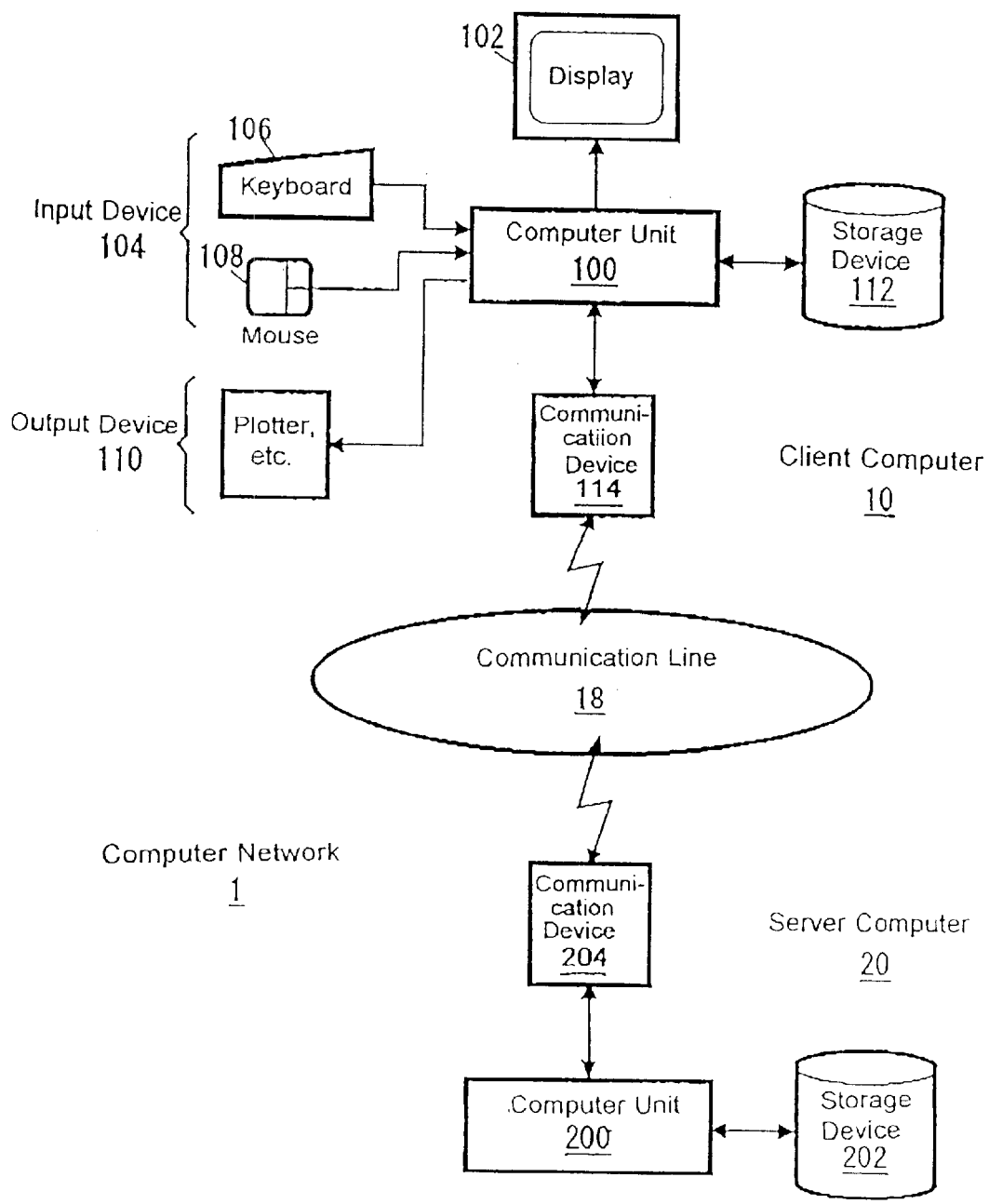

[Figure 2]
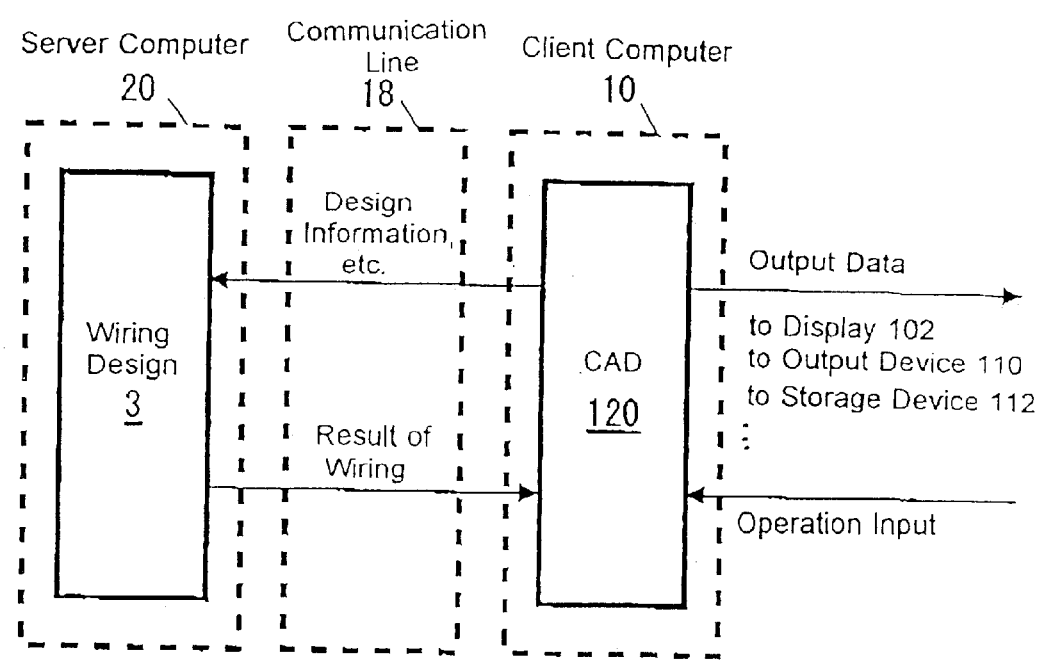

[Figure 3]
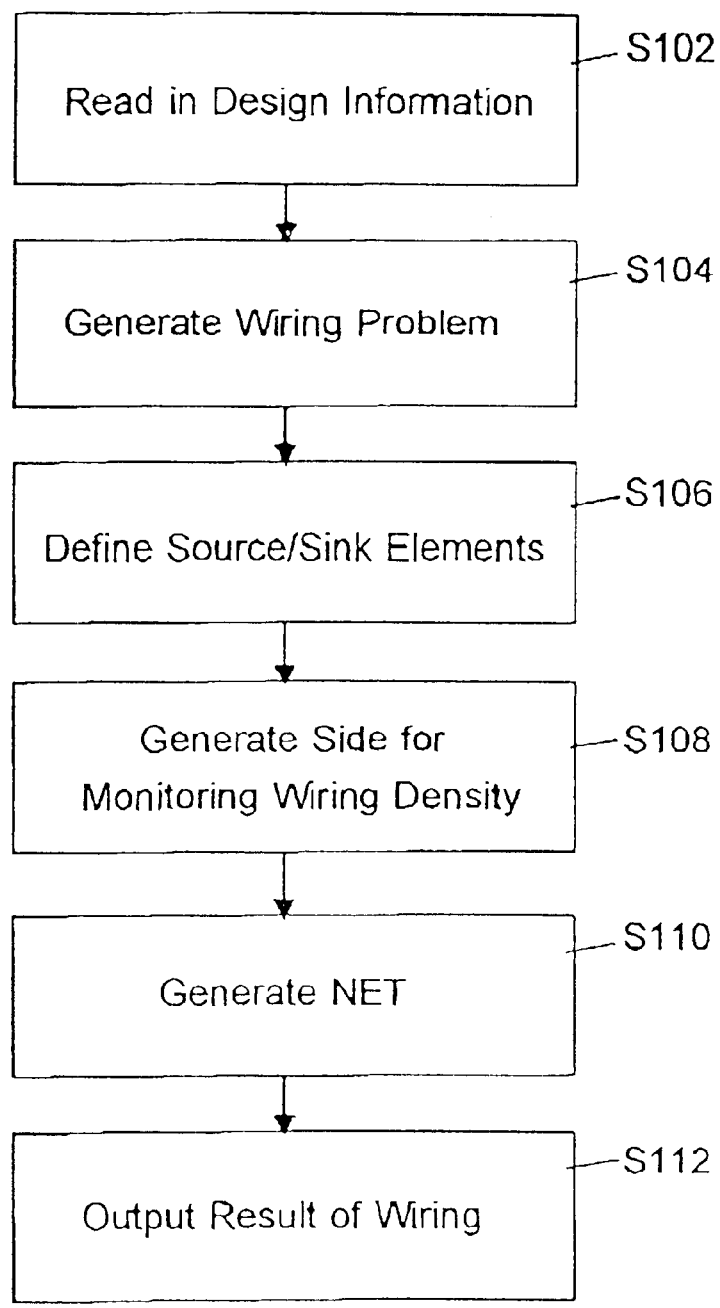

[Figure 4]
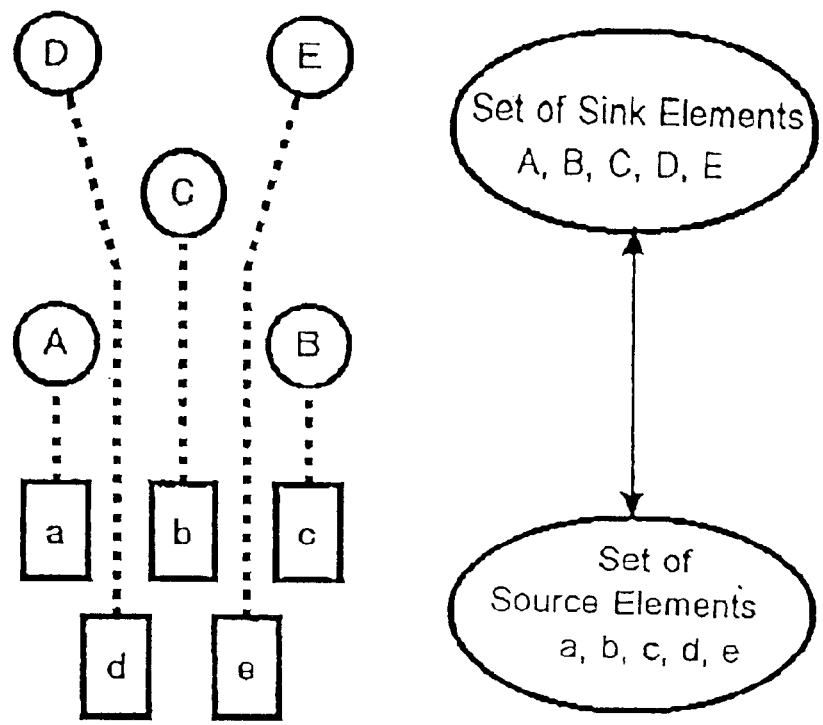
Remarks
▪▪▪▪▪ Route NET Generated
◯ Sink Element Terminal
▢ Source Element Terminal

[Figure 5]
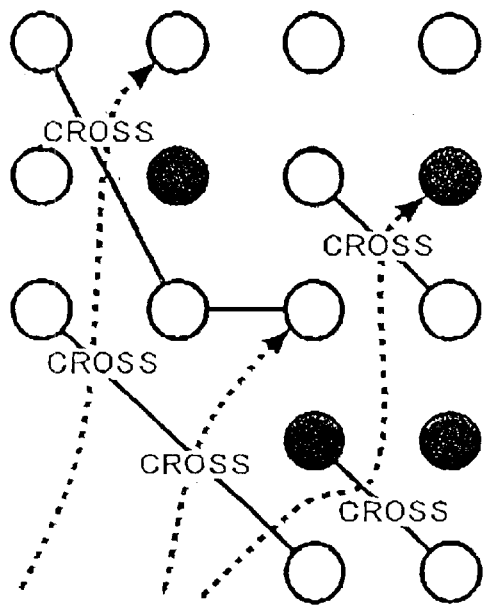
Remarks
  Sink (or Source) Element
  Wiring Prohibiting Area
────  Side for Monitoring Wiring Density
▪▪▪▶  Wiring under Searching
CROSS  Crossing of Wiring under Searching and the Side

[Figure 6]
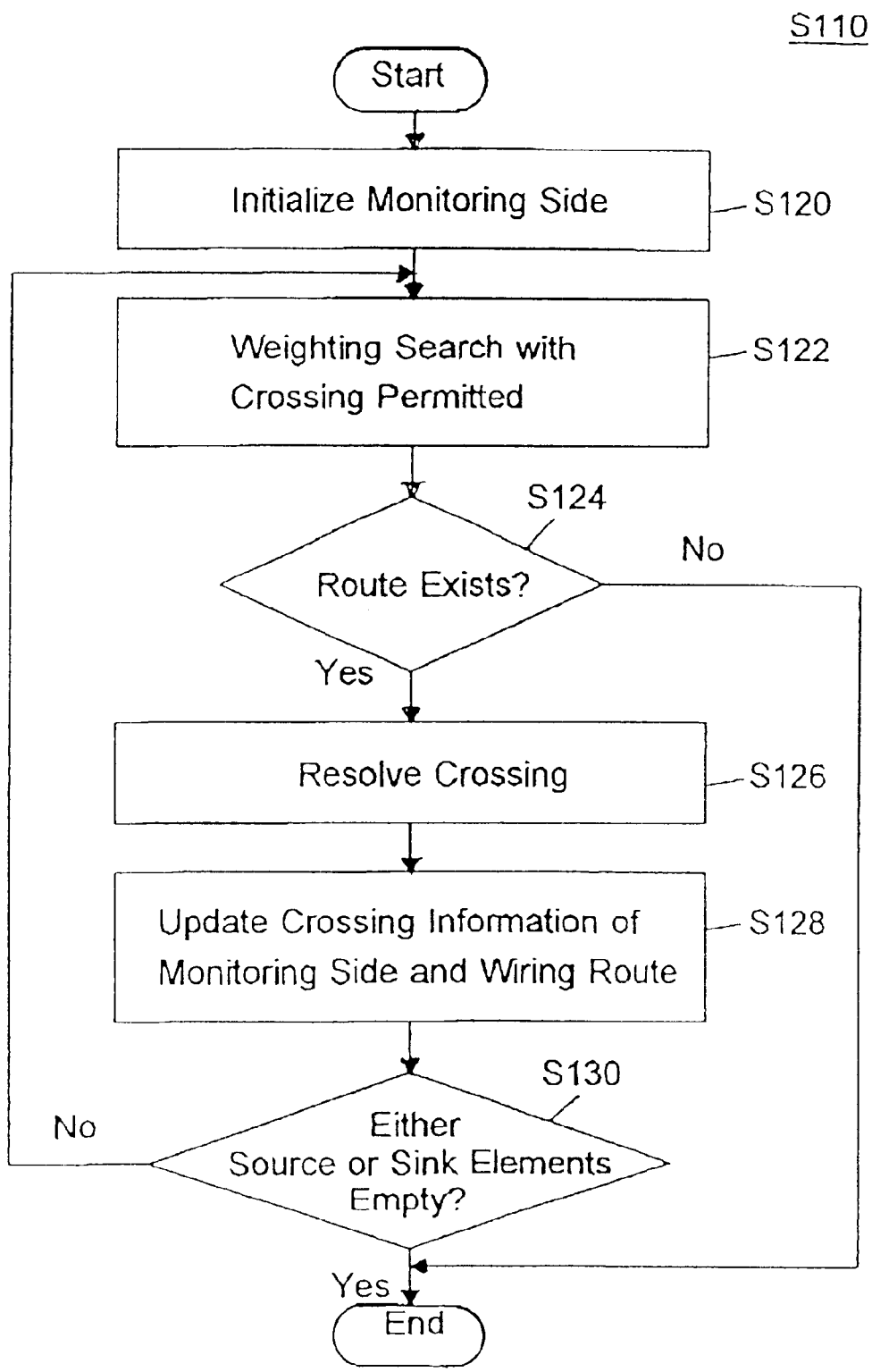

[Figure 7]
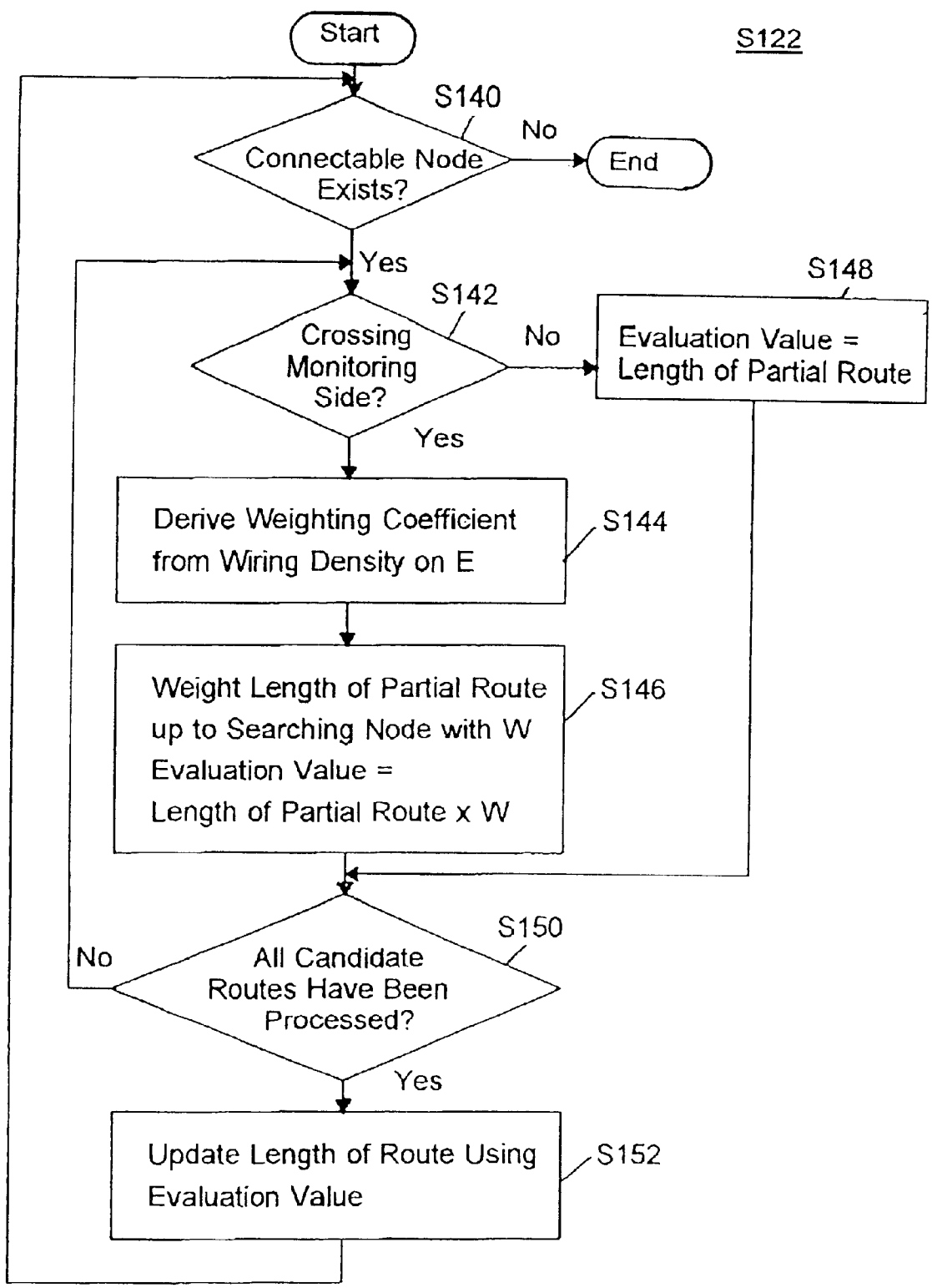

[Figure 8]
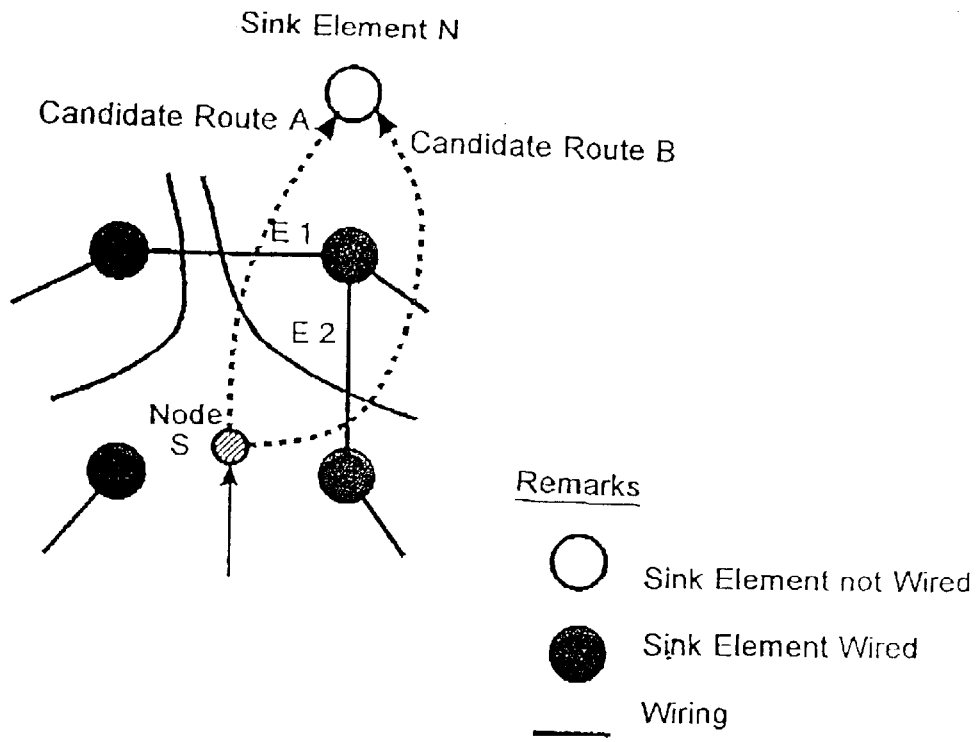
[Figure 9]
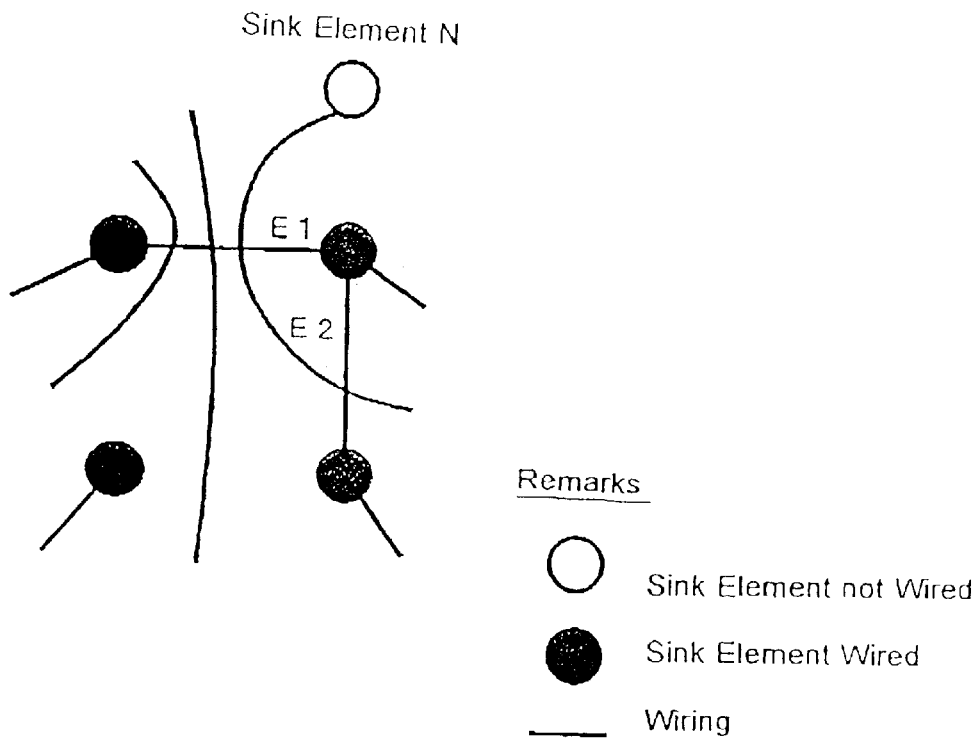

[Figure 10]
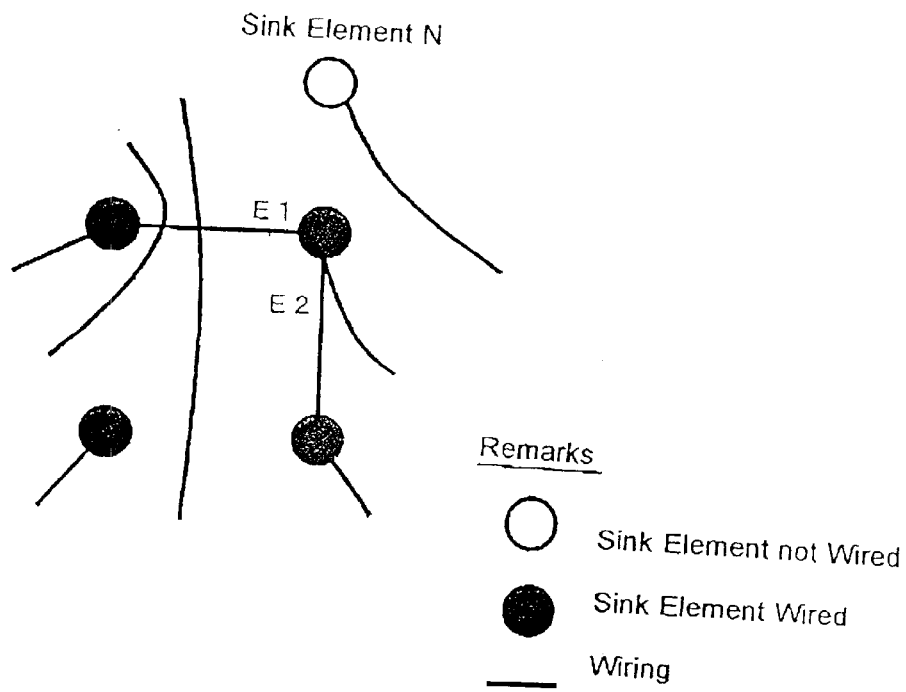
[Figure 12]
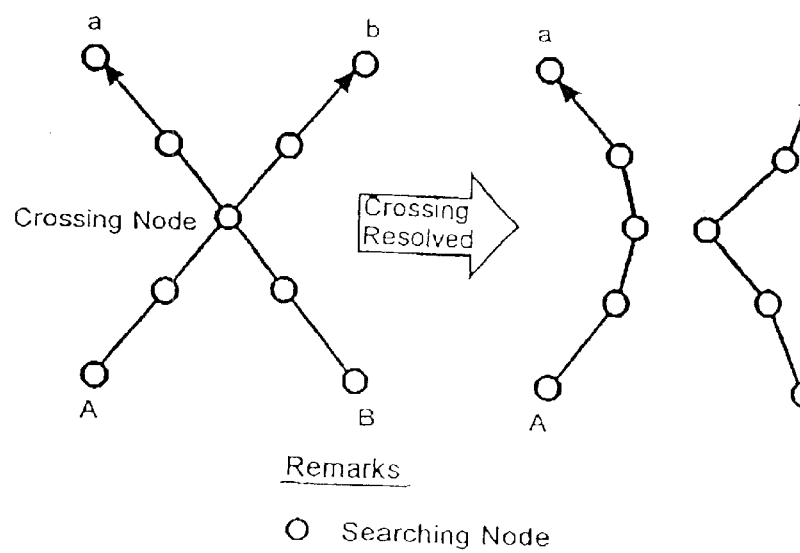

[Figure 11]
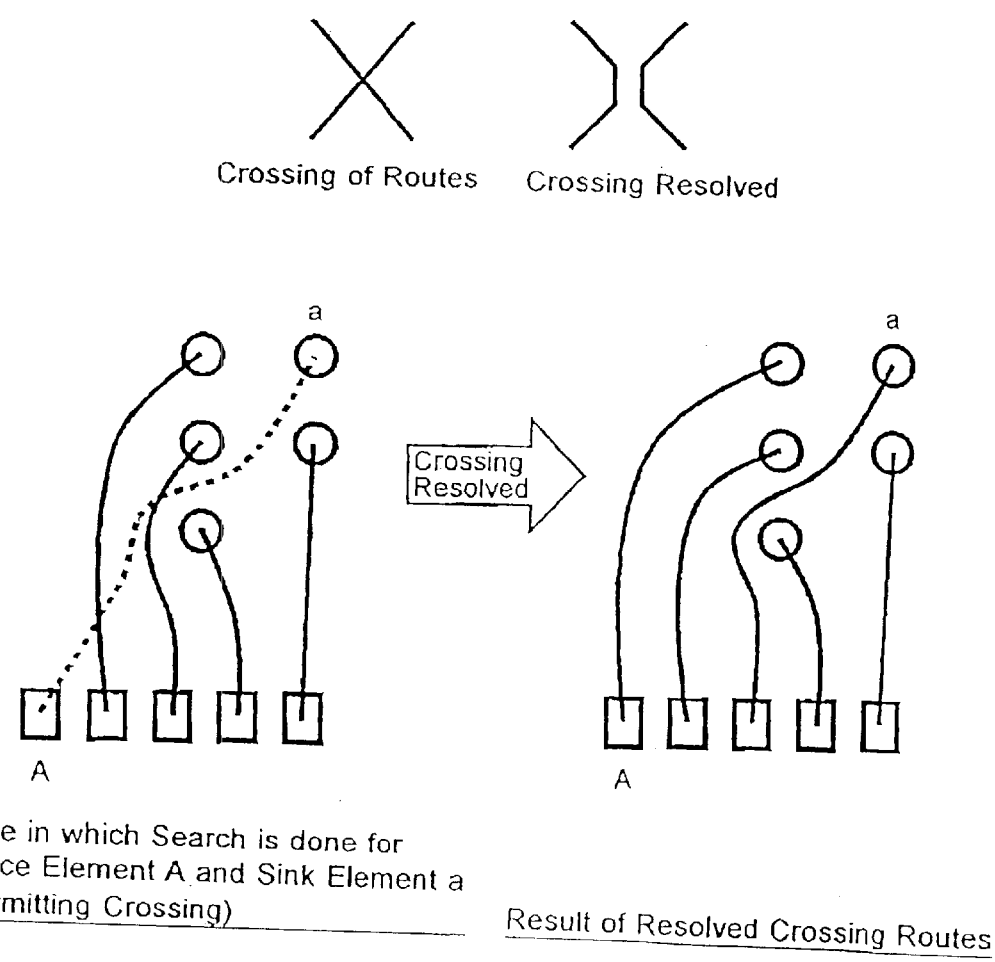
Crossing of Routes    Crossing Resolved
Route in which Search is done for
Source Element A and Sink Element a
(Permitting Crossing)
Result of Resolved Crossing Routes

WIRING DESIGN APPARATUS AND METHOD THEREOF

FIELD OF THE INVENTION

This invention relates to wiring design apparatus and a method thereof for designing an optimum route of wiring between bonding pads disposed on a semiconductor chip and pins (terminals) disposed in a semiconductor package.

BACKGROUND OF THE INVENTION

PUPA 5-143689 and others disclose wiring design apparatus for automatically or semi-automatically designing wiring of a printed circuit substrate used in electronic equipment for wiring between bonding pads disposed on a semiconductor chip and pins (terminals) disposed on a semiconductor package.

With such prior art technology, wiring of a semiconductor package can be automatically or semi-automatically done according to a design rule indicating the upper limits of a space between pins and the width of the wire occupying the space between the pins.

However, the wiring design of such prior art technology may result in a local concentration of wiring due to a condition of disposition of parts and the positional relationship of pins. The local concentration of wiring may cause deterioration of the electrical characteristic of a product and has to be eliminated.

In order to eliminate such concentration of wiring, a manual correction of the wiring and change of disposition of parts have been so far employed.

This invention is conceived in view of the above described problems of the prior art technology and aims at providing a wiring design apparatus and a method thereof for automatically designing wiring which conforms to a design rule and does not involve a local concentration of wiring without requiring a manual correction of wiring and disposition of parts.

It is another object of this invention to provide a wiring design apparatus and a method thereof which allows wiring to be designed according to a design rule without depending on net information of the disposition of parts and the positional relationship of pins interconnected and with a local concentration of wiring suppressed.

BRIEF SUMMARY OF THE INVENTION

In order to achieve the above objectives, this invention provides a wiring design apparatus for designing wiring which provides connections among a plurality of terminal points provided on one plane in a route passing an area on said plane other than an area where wiring is prohibited, comprising; monitoring side generating means for generating a virtual side for monitoring wiring density (monitoring side) between any two of said terminal points and wiring prohibiting areas (element) on said plane, and wiring design means for designing routes of wiring (wiring routes) connecting said terminal points based on the width of wiring crossing each of said monitoring side.

Preferably, said wiring design means generates wiring route according to a design rule at least indicating the space of said elements, the proportion of the width of said wiring occupying the space between said elements (wiring density), the space between wires of said wiring, and the width of said wiring.

Preferably, said wiring design means further comprises; candidate route generating means for successively searching the routes of said wiring according to said design rule for each of portions of each route which is divided into one or more portions (partial routes) from a terminal point where said wiring starts to a terminal point where it terminates to generate one or more candidates of said partial route (candidate routes), route length evaluating means for calculating the value of a route length evaluation of each of said candidate routes based on the length of said candidate routes generated and the wiring density of the monitoring side crossing said candidate route, said value of route length evaluation assuming a larger value when the length of said candidate route is longer and when the width of wiring crossing said monitoring side which is crossed by said candidate route is wider, route selecting means for selecting a candidate route having the minimum value of said calculated route length evaluation as said partial route among said generated candidate routes, and partial route connecting means for connecting said selected partial route to design the route of each of said wiring.

Preferably, said route length evaluating means calculates said value of route length evaluation by multiplying the route length of each of said candidate routes by a weighting coefficient which assumes a larger value when the wiring density of said monitoring side crossing each of said generated candidate routes is larger.

Preferably, said candidate route generating means generates said candidate route while allowing it to cross other wiring routes, said route length evaluating means calculates the value of the route length evaluation of said candidate route generated with crossing allowed, and said route selecting means changes another wiring route crossing said selected partial route with said partial route which is so selected as to eliminate crossing.

The wiring design apparatus of this invention designs wiring which connects between bonding pads of a semiconductor chip and pins (terminals) of a semiconductor package in a route passing wiring plane of the semiconductor package while avoiding wiring prohibiting area of the semiconductor package, conforming to the design rule and suppressing a local concentration of wiring.

A connection between bonding pads of a semiconductor chip and pins (terminals) of a semiconductor package is now described hereunder as an example.

The monitoring side generating means generates a virtual side (monitoring side) used for determining whether or not a concentration of wiring occurs in a portion where it is empirically assumed that wiring tends to concentrate, such as a space between neighboring terminal pins disposed in a corner of a pin grid array, or a space between neighboring pins and a prohibiting area in the wiring plane of a semiconductor package.

The wiring designing means extends partial routes successively from a bonding pad based on design information indicating the relationship of connection between a pin of a semiconductor package and a bonding pad of a semiconductor chip, and wiring density in the space (the width of wiring occupying the space) between pins, prohibiting areas, or a pin and a prohibiting area (a pin and a prohibiting area are collectively referred to as an element).

Further, the wiring designing means successively selects a partial route so as to relax the wiring density on the monitoring side to design a wiring route between pins and bonding pads.

In the wiring designing means, the candidate route designing means generates one or more candidate(s) of a route which can connect from a node to a next node starting at the beginning point of wiring toward a terminating point while allowing crossing with another wiring according to a design rule and using a search algorithm such as Dijkstra method, for example.

Specifically, the candidate route designing means generates as many routes as possible successively connecting from a bonding pad to a first node, from a node to a next node, or from a node to a pin and provides them as candidate routes.

The route length evaluating means provides the length of a candidate route as a value of the route length evaluation when the candidate route does not cross a monitoring side while it provides the length of a candidate route multiplied by a coefficient as a candidate route when the candidate route crosses the monitoring side, the coefficient depending on the wiring density (on the monitoring side) of wiring which has been so far drawn so as to trace a route crossing the monitoring side.

For example, the route length evaluating means calculates a value of the route length evaluation which assumes a larger value when the candidate route is longer and the wiring density of monitoring sides crossing a candidate route is larger, for example, by using a coefficient of "1" when a candidate route crosses a monitoring side which is not crossed by any other wiring and a coefficient of "10" when a candidate route crosses a monitoring side having wiring density no less than 50%.

The route selecting means selects a candidate route assuming the smallest value of the route length evaluation as a partial route between the nodes (pin or bonding pad).

Specifically, the route selecting means selects a candidate route which is short and passes a monitoring side having a low wiring density as a partial route in that section while eliminating an unusually long candidate route and a partial route passing a portion where wiring are locally concentrated even though they are short so as to optimize the length of wiring and the wiring density.

Further, the route selecting means automatically modifies the design information so as to eliminate crossing when the selected candidate route crosses another wiring.

This invention provides a wiring design method for designing wiring which provides connections among a plurality of terminal points provided on one plane in a route passing an area on said plane other than an area where wiring is prohibited, comprising the steps of; generating a virtual side for monitoring a wiring density (monitoring side) between any two of said terminal points and wiring prohibiting area (element) on said plane, successively searching the routes of said wiring according to a design rule indicating a space between said elements and a proportion of the width of said wiring occupying the space between said elements (wiring density) for each of portions of each route which is divided into one or more portions (partial routes) from a terminal point where said wiring starts to a terminal point where it terminates to generate one or more candidates of said partial route (candidate routes), calculating the value of a route length evaluation of each of said candidate routes based on the length of said candidate routes generated and the wiring density of the monitoring side crossing said candidate route, said value of route length evaluation assuming a larger value when the length of said candidate route is longer and when the width of wiring crossing said monitoring side which is crossed by said candidate route is wider, selecting a candidate route having the minimum value of said calculated route length evaluation as said partial route among said generated candidate routes, and connecting said selected partial route to design the route of each of said wiring.

This invention also provides a recording medium recording a program for designing wiring which provides connections among a plurality of terminal points provided on one plane in a route passing an area on said plane other than an area where wiring is prohibited, comprising; monitoring side generating step for generating a virtual side for monitoring wiring density (monitoring side) between any two of said terminal points and wiring prohibiting areas (element) on said plane, and wiring design step for designing routes of wiring (wiring routes) connecting said terminal points based on the width of wiring crossing each of said monitoring side.

BRIEF DESCRIPTION OF THE DRAWINGS

FIG. 1 is a diagram showing an example of a configuration of a computer network to which this invention is applied.

FIG. 2 is a diagram showing an example of apportionment of functions between the client computer 10 and the server computer 20 shown in FIG. 1.

FIG. 3 is a flow chart showing the process of the wiring design software 3 shown in FIG. 2.

FIG. 4 is a diagram showing an example of classifying and correlating process (S106) of source and sink elements shown in FIG. 3.

FIG. 5 is a diagram showing an example of a process to generate a monitoring side shown in FIG. 3.

FIG. 6 is a flow chart showing the net generation process (S110) shown in FIG. 3.

FIG. 7 is a flow chart showing the weighting search process with crossing permitted (S122) shown in FIG. 6.

FIG. 8 is the first figure showing the process of weighting search process (S122) shown in FIG. 6 and FIG. 7.

FIG. 9 is the second figure showing the process of weighting search process (S122) shown in FIG. 6 and FIG. 7.

FIG. 10 is the third figure showing the process of weighting search process (S122) shown in FIG. 6 and FIG. 7.

FIG. 11 is a diagram showing an example of a process (S124) of resolving crossing of wiring shown in FIG. 6.

FIG. 12 is a diagram showing the crossing point of the wiring shown in FIG. 11 with enlargement.

DETAILED DESCRIPTION OF THE INVENTION

While this invention is described hereunder taking an application of the invention to wiring of a semiconductor package as an example, this invention is further applicable to a wide use including a design of a printed circuit substrate and the like.

Described hereunder is a computer network 1 to which the wiring design method and wiring determination method of this invention are applied.

FIG. 1 is a diagram showing an example of a configuration of a computer network 1 to which this invention is applied.

As shown in FIG. 1, the computer network 1 comprises n client computers 10, a communication line 18 and a server computer 20 (FIG. 1 shows a case where n=1 as an example).

FIG. 2 is a diagram showing an example of apportionment of functions between the client computer 10 and the server computer 20 shown in FIG. 1.

As exemplarily shown in FIG. 2, in the computer network 1, the client computer 10 executes a CAD (computer aided design) software 120 of designing a semiconductor chip while the server computer 20 executes a wiring design software 3 of designing wiring between bonding pads of a semiconductor chip and pins of a semiconductor package. Incidentally, the wiring design method of this invention may be also implemented by a configuration in which the same computer executes the CAD software 120 and the wiring design software 3.

With these components, the computer network 1 designs wiring connecting the bonding pads and the pins in a route which makes the length of wiring preferably short and avoids a local concentration of wiring based on information indicating the position of the bonding pads of a semiconductor chip (pad position information), information indicating the position of the terminals (pins) of a semiconductor package (pin position information), information indicating the relationship of connection between the bonding pads and the pins (wiring information), and information indicating an area in which wiring is prohibited (wiring prohibiting area) on wiring planes of the semiconductor package. The pad position information, the pin position information and the wiring information are hereafter collectively referred to as "design information". The design information has a data structure which correlates wiring (NET), bonding pads (Pad), and pins (Pin) in the form shown in the table 1 below.

TABLE 1

Example of design information

| | |
|---|---|
| NET-A, | Par 1Pin 20 |
| NET-B, | Par 13Pin 4 |
| NET-C, | Par 25Pin 15 |
| NET-D, | Par 11Pin 94 |

The communication line 18 is a LAN, a leased line, an ISDN line or a switched telephone line which is capable of data communication and transmits data between the client computer 10 and the server computer 20.

Referring back to FIG. 1, the client computer 10 comprises a computer unit 100, a display device 102 such as a CRT display device or a liquid crystal display device, an input device 104, an output device 110 including a printer device and a plotter device, a storage device 112 such as a hard disk device or a magneto-optical (MO) disk device, and a communication device 114.

The input device 104 which includes a keyboard 106 and a mouse 108 receives information required for designing or modifying the design of a semiconductor circuit and information relating to the disposition of pins of a semiconductor package, and inputs them to the computer unit 100 in response to an operation by a user.

The storage device 112 stores data such as the CAD software 120 shown in FIG. 2, information inputted via the input device 104, information indicating the semiconductor circuit designed by the CAD software 120, information indicating the disposition of the circuit and the bonding pads taken when the designed semiconductor circuit is implemented as a physical semiconductor chip, and information indicating wiring between pins of the semiconductor package and bonding pads of the semiconductor chip which is sent from the server computer 20, and outputs the stored data to the computer unit 100 as requested.

The communication device 114 is an Ethernet adapter, a token ring adapter, an FDDI, a TA (terminal adapter) or a modem and transmits data between the client computer 10 and the server computer 20 via the communication line 18.

The computer unit 100 which comprises a CPU, a memory and peripheral circuits thereof has a function of a so called personal computer or a work station and controls the components of the client computer 10.

The computer unit 100 loads the CAD software 120 shown in FIG. 2 from the storage device 112 to the memory for execution and effects the following process.

The computer unit 100 designs a semiconductor circuit based on information required for designing the semiconductor circuit which is inputted via the input device 104, further designs the disposition of the circuit and bonding pads of the designed semiconductor circuit and outputs them to the display device 102, the output device 110 and the storage device 112.

The computer unit 100 also generates design information indicating the disposition of the bonding pads of the designed semiconductor circuit and connection of each bonding pad to a particular pin of the semiconductor package and transmits it to the server computer 20 (design information generating process).

The computer unit 100 also displays the resulting wiring between the pins of the semiconductor package and the bonding pads inputted from the server computer 20 in the display device 102 for presentation to a user.

When the resulting wiring displayed in the display device 102 and the like ends up with a failure such as a failure to completely wire between pins and bonding pads without crossing (absence of wiring solution), the user modifies the disposition of the semiconductor circuit and the bonding pads and inputs design change information to resolve the illegality of wiring by operating the input device 104. The computer unit 100 changes the design of the disposition of the semiconductor circuit and/or the circuit thereof, and the bonding pads, further generates a new design information based on the result of the design, and outputs it to the server computer 20.

The server computer 20 comprises a computer unit 200, a storage device 202 and a communication device 204 as shown in FIG. 1.

The storage device 202 stores the wiring design software 3, information required for designing wiring between the bonding pads of the semiconductor chip and the pins of the semiconductor package, and data indicating the result of wiring, and outputs the stored data to the computer unit 200 as requested.

The communication device 204 transmits data between the client computer 10 and the server computer 20 via the communication line 18 under the control of the computer unit 200 in the manner similar to the communication device 114.

The computer unit 200 comprises a CPU, a memory and peripheral circuits thereof and controls the components of the server computer 20 in the manner similar to the computer unit 100.

The computer unit 100 loads the wiring design software 120 shown in FIG. 2 from the storage device 202 to the memory for execution and designs wiring connecting the bonding pads of a semiconductor chip and the pins of a semiconductor package based on the design information transmitted from the client computer 10 as described hereunder.

The computer unit 200 also generates data indicating the presence or absence of wiring solution and an illegal wiring, and what illegal wiring exists between which bonding pad and which pin, and outputs it to the client computer 10 as the result of wiring.

FIG. 3 is a flow chart showing the process of the wiring design software 3.

As shown in FIG. 3, in step 102 (S102), the wiring design software 3 reads in the design information which the computer unit 200 received from the client computer 10.

In step 104 (S104), the wiring design software 3 analyzes the design information read in, replaces the bonding pads and the pins with points on the wiring plane of a semiconductor package and generates data indicating the positional relationship of the points (this data is also hereinafter referred to "wiring problem" deeming it to be a problem which the wiring design software 3 solves to obtain a connection solution).

FIG. 4 is a diagram showing an example of a classifying and correlating process (S106) of source and sink elements shown in FIG. 3.

In step 106 (S106; FIG. 3), the wiring design software 3 places the points corresponding to the bonding pads and the pins on the semiconductor package of the wiring problem in the source elements from which wiring is drawn out and in the periphery of the source elements as shown in the left side of FIG. 4 [when the semiconductor package is a pin grid array (PGA), for example], classifies the points corresponding to the pins into sink elements to which wiring is taken in, correlates the source and sink elements connected to each other as shown in the right side of FIG. 4, and successively takes them out for storage.

The reference to source and the sink elements are for convenience of description and the points corresponding to the bonding pads and the pins may be referred to as sink and source elements conversely. The names of the sink and the source elements are irrelevant to the direction of signals.

The client computer 10 may classify the source and the sink elements and the wiring design software 3 may further modify the classification given in the side of the client computer 10 in the process of S106.

FIG. 5 is a diagram showing an example of a process to generate a monitoring side shown in FIG. 3. As used herein, "side" is given its mathematical interpretation of a line between two points.

In FIG. 5, a white circle shows a sink element, a black circle shows wiring prohibiting area, a dotted line shows wiring which is searching a wiring route and "CROSS" shows that a monitoring side E crosses wiring.

In step 108 (S108; FIG. 3), the wiring design software 3 generates one or more virtual side (monitoring side E) for monitoring wiring route between two arbitrary sink elements and/or between an arbitrary sink element and wiring prohibiting area to avoid a local concentration of wiring as exemplarily shown in FIG. 5.

The monitoring side need not be generated for all pairs of neighboring elements. For example, it is enough to generate the monitoring side in a portion where it is empirically known that wirings tend to be concentrated on a wiring plane of a semiconductor package and between two of neighboring sink elements and a wiring prohibiting area (they are collectively referred to simply as an element) which are disposed in a portion where there are many wirings conveying high frequency signals and the concentration of wiring tends to cause deterioration of the performance of a semiconductor device.

Further, the monitoring side E may be replaced with a search graph used in route searching or data used for capacity check of the result of the wiring design.

A condition which a monitoring side E is shown in the table below.

TABLE 2

Condition which a monitoring side E should satisfy (1) A monitoring side E has a length.
(2) 2 elements are positioned individually and identifiably at the ends of a monitoring side E.
(3) A design rule available for searching wiring route is set up at the ends of a monitoring side E.
(4) It can be determined whether or not a monitoring side E crosses a partial route in the wiring route searching process.
(5) The width of wiring crossing a monitoring side E (sum of the widths of wiring when a plurality of wires cross each other) is available in selecting a partial route.

In step 110 (S110; FIG. 3), the wiring design software 3 designs wiring connecting between a sink element and a source element corresponding to each other (NET generation).

In the process of S110, if wiring conforming to the design rule can not be derived when all source and sink elements have been connected, the process is ended and information indicating that effect is outputted to the client computer 10.

The NET generation process is further described with reference to FIG. 6 and FIG. 7.

FIG. 6 is a flow chart showing the NET generation process (S110) shown in FIG. 3.

FIG. 7 is a flow chart showing the weighting search process with crossing permitted (S122) shown in FIG. 6.

As shown in FIG. 6, in step 120 (S120), the wiring design software 3 initializes information relating to a monitoring side E, that is, information indicating which wiring each of the monitoring sides E generated in the process of S108 crosses.

In step 122 (S122), the wiring design software 3 effects a process of searching weighting which permits crossing shown in FIG. 7.

To clarify the following description, a node, a partial route and a candidate route are now described.

A node is defined as a crossing point between wiring and a lattice side of a rectangular lattice mesh which is virtually formed on a semiconductor package in searching a route of wiring.

A wiring route is searched in the wiring design software 3 by searching one or more wiring routes connecting a source element (bonding pad of a semiconductor chip) and the nearest lattice side, further searching successively an extending wiring route from a node on the lattice side to a node on another nearest lattice side, and finally searching wiring route from a node on a lattice side nearest a sink element to that sink element. As such, a node plays an important role in searching the wiring route.

A wiring route connecting a source element to a node, a node to a node, and a node to a sink element are called a "partial route". A wiring route located in the search as a wiring route which may potentially be a partial route, whether or not it is actually selected as a partial route, is also called a partial route.

In step 140 (S140), the wiring design software 3 determines whether or not there is a node finally connected to a source node (latest node) and a next node which can be connected with a condition of wiring capacity satisfied. When there is a connectable node, the wiring design software 3 searches every route which can connect the latest node to a next node using the Dijkstra method for checking whether or not the wiring capacity satisfies the design rule and proceeds to the process of S142. The wiring design software 3 ends the process and proceeds to the process of searching a next wiring route when there is no connectable node.

The Dijkstra method is a well known algorithm originated by E. W. Dijkstra to find the shortest path between two given points. See, for example, O'Rourke, Joseph, *Computational Geometry in C,* Cambridge University Press, pp. 270–276 (1994), the disclosure of which is incorporated by reference herein. Other shortest-path algorithms are also suitable for use in the present invention.

By applying the Dijkstra method whereby the crossing point is put between a lattice mesh and wiring, the shortest route can be efficiently searched. Incidentally, a newly searched wiring route is permitted to cross another wiring route which has then been located in the search.

In step 142 (S142), the wiring design software 3 determines whether or not any of the candidate routes located in the search in the process of S140 crosses a monitoring side E and proceeds to the process of S150 if it does not cross. Otherwise it proceeds to the process of S144. In step 148 (S148), the wiring design software 3 deems the length of a candidate route not crossing the monitoring side to be the value of the route length evaluation as it is.

In step 144 (S144), the wiring design software 3 derives a weighting coefficient W which depends on the proportion of the sum of the widths of wiring to be processed and another wiring crossing a monitoring side E which is determined to cross in the process of S142 occupying the length of the monitoring side E (wiring density).

The value of the weighting coefficient W is a real number no less than 1 and assumes a larger value when the wiring density of the monitoring side crossing a candidate route is higher.

The wiring design software 3 may derive the coefficient W by substituting a predetermined function with the wiring density or referring to a table which correlates a weighting coefficient W obtained beforehand by an experiment as an optimum value for the value of each wiring density with the value of the wiring density.

A table of the weighting coefficient and the wiring density is shown in Table 3 as an example.

Because it is expected that the weighting coefficient has differing optimum values depending on the design information, it is preferable to allow the weighting coefficient to be modified depending on the content of the wiring problem or the result of processing.

TABLE 3

Table of correlating the weighting coefficient to the wiring density

| Wiring density on the monitoring side E (%) | Weighting coefficient W (Multiple) |
| --- | --- |
| 0 to less than 50 | 1 |
| 50 to less than 70 | 5 |
| 70 to less than 80 | 10 |
| 80 to less than 90 | 20 |
| 90 to less than 100 | 40 |
| 100 | Determined to be impossible to wire on the corresponding monitoring side |

In step 146 (S146), the wiring design software 3 calculates a value of route length evaluation of a candidate route by multiplying the length of the candidate route with a weighting coefficient W derived in S144.

In step 150 (S150), the wiring design software 3 determines whether or not the wiring length evaluation values have been calculated for all candidate routes searched between the latest node to a next node and proceeds to the process of S152 if the wiring length evaluation values have been calculated for all candidate routes. The wiring design software 3 returns to the process of S142 if the wiring length evaluation values have not been calculated for all candidate routes.

In step 152 (S152), the wiring design software 3 selects a candidate route having the lowest value of the wiring length evaluation to deem it to be the partial route from the latest node to the next node in the process up to S146 and proceeds to the process of S140 with the "next node" in this processing loop being the "latest node" in the processing loop of the next round.

The weighting search process described in the above is further described with reference to FIG. 8 to FIG. 10.

FIG. 8 to FIG. 10 are the first to the third figures showing the process of weighting search process (S122) shown in FIG. 6 and FIG. 7.

As shown in FIG. 8, a specific example is given in which 2 candidate routes A and B have been searched by the wiring route search permitting crossing from the latest node (node S) to the sink element N and the candidate routes A and B cross the monitoring sides E1 and E2 of a same length.

As seen with reference to FIG. 8, the candidate route A is shorter than the candidate route B. However, one previous wire has crossed the monitoring side E2, which the candidate route B crosses, while two wires have crossed the monitoring side E1, which the candidate route A crosses.

In such case, if the shorter candidate route A is simply selected as a partial route in the process of S122, 3 wires cross the monitoring side E1 while a single wire crosses the monitoring side E2 resulting in a local concentration of wiring as shown in FIG. 9.

On the other hand, if the candidate route B is selected as a partial route in the process of S122, the wiring are prevented from concentrating though the length of the wiring is longer than the case where the candidate route A is selected so that the electrical characteristic of this portion is improved as a whole.

Specifically, by multiplying the length of the candidate route with a weighting coefficient W which assumes a larger value as the wiring density of the monitoring side crossing the candidate route is higher for weighting in S146 (FIG. 7), and selecting the candidate route having the smallest value of the weighted wiring length evaluation as a partial route, both the length of the wiring and the wiring density can be optimized.

FIG. 6 is referred to again.

In step 124 (S124; FIG. 6), the wiring design software 3 determines whether or not the process of S122 was able to derive wiring between a source element and a sink element. When the wiring was derived, the wiring design software 3 proceeds to the process of S126 while it notifies the client computer 10 of that effect and ends the process when the wiring was not derived.

FIG. 11 is a diagram showing an example of a process (S124) of resolving crossing of wiring shown in FIG. 6.

In step 126 (S126; FIG. 6), the wiring design software 3 resolves crossing of wiring as shown in FIG. 11.

Because the wiring route is searched while allowing crossing in the process of S122, wiring connecting a source element A and a sink element is derived in a state crossing another wiring as shown by a dotted line in the middle of FIG. 11.

Such wiring crossing each other is separated at the crossing point as shown in the left side of FIG. 11 to obtain wiring which has resolved crossing as shown in the right side of FIG. 11.

A method of resolving crossing of wiring is further described with reference to FIG. 12.

FIG. 12 is a diagram showing the crossing point of the wiring shown in FIG. 11 with enlargement.

As shown in the left side of FIG. 12, when wiring Ab connecting a source element (node) A and a sink element (node) b crosses wiring Ba connecting a source element (node) B and a sink element (node) a at a crossing node in the process of S122, the wiring design software 3 tests in which direction any of these wiring is threading along the direction of the progress of wiring (the direction from a source element to a sink element).

When the wiring design software 3 determines that the wiring Ab threads from the left to the right with respect to the crossing node in the case shown in the left side of FIG. 12, it separates the crossing node as shown in the right side of FIG. 12 and exchanges the wiring routes to resolve the crossing of wiring. Therefore, the wiring Ab and Ba are changed to wiring Aa and Bb.

Referring back to FIG. 6 now, in step 128 (S128), the wiring design software 3 detects which monitoring side is crossed by the wiring which is modified by the process of resolving the crossing of the wiring in S126 and updates crossing information indicating the status of crossing between the wiring and the monitoring side.

In step 130 (S130), the wiring design software 3 determines whether or not either all the source elements or all the sink elements have been processed and the remaining element is empty and notifies the client computer 10 of the end of wiring design process, ends processing and returns to the process of S112 (FIG. 3) if the element is empty while it returns to the process of S122 if the element is not empty.

Referring back to FIG. 3, in step 112 (S112), the wiring design software 3 outputs the result of the wiring design obtained by the above process to the client computer 10.

The operation of the computer network 1 is described hereunder.

A user operates the client computer 10 (FIG. 1) to generate design information by correlating the bonding pads of a semiconductor chip to the pins of a semiconductor package.

When the design information has been completed, the user sends the design information to the server computer 20 and starts the wiring design software 3 to design wiring.

The wiring design software 3 reads in the design information sent from the client computer 10 (FIG. 3, S102) and analyzes the design information read in to generate the wiring problem (FIG. 3, S104).

The wiring design software 3 then classifies the bonding pads and the pins on the semiconductor package of the wiring problem into source elements and sink elements (FIG. 4) and stores them in correlation each other (FIG. 3, S106).

The wiring design software 3 then generates one or more virtual sides (monitoring sides E; FIG. 5) used for monitoring a wiring route between two arbitrary sink elements and/or between an arbitrary sink element and a wiring prohibiting area (FIG. 3, S108).

The wiring design software 3 then initializes information relating to the monitoring side E (FIG. 3, S110; FIG. 6, S120) and effects the weighting search process with crossing permitted (FIG. 6 and FIG. 7, S122).

The wiring design software 3 then determines whether or not there are the latest node and a next node and searches for a candidate route using the Dijkstra method and the like with wiring capacity checking if there is a connectable node. If there is no connectable node, the wiring design software 3 ends processing and proceeds to a route search process for the next wiring. (FIG. 7, S140).

The wiring design software 3 then determines whether or not any of the candidate routes located in the search crosses the monitoring side E and calculates the route length evaluation value which weights the length of the candidate route by a weighting coefficient W when there is crossing (FIG. 7, S144, S146) while it deems the length of the candidate route itself to be the route length evaluation value when there is no crossing (FIG. 7, S148).

The wiring design software 3 then determines whether or not processing has been completed for the candidate route between the latest node and the next node (FIG. 7, S150) and selects a candidate route having the lowest wiring length evaluation value as a partial route when the processing has been completed (FIG. 7, S152; FIG. 8 to FIG. 10).

The wiring design software 3 then determines whether or not wiring between a source element and a sink element has been derived, and resolves the crossing of the wiring and updates crossing information between the monitoring side and the wiring route when the wiring has been derived (FIG. 6, S126, S128; FIG. 11 and FIG. 12). When the wiring was not derived, the wiring design software 3 notifies the client computer 10 of that effect and ends processing (FIG. 6, S124).

Finally, the wiring design software 3 determines whether or not processing has been completed for all the source and the sink elements and notifies the client computer 10 of the end of the wiring design processing and sends the result of the wiring to the client computer 10 when the processing has been completed (FIG. 3, S112). When the processing has not been completed, the wiring design software 3 returns to the weighting search process with crossing permitted (FIG. 6, S122, S130).

As described in the above, the wiring design method of this invention can suppress a local concentration of wiring simply by adding a simple weighting process to the conventional wiring design method using Dijkstra method and the like and is easily implemented in a conventional wiring design apparatus because there is no need to add a large amount of data.

In addition, because a simple weighting process and the like is added to a conventional wiring design method in the wiring design method of this invention, the processing time is almost the same as a conventional wiring design method.

Further, the length of wiring and the wiring density can be more optimized by making the weighting coefficient W adjustable depending on the result of processing in the wiring design method of this invention.

As described in the above, this invention allows wiring to be automatically designed while conforming to the design rules and without involving a local concentration of wiring, and further obviates a manual modification of wiring and disposition of parts.

Further according to this invention, this invention allows wiring to be designed while conforming to the design rule and suppressing a local concentration of wiring without depending on the net information of disposition of parts and the positional relationship of the pins interconnected.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A wiring design apparatus for designing wiring which provides connections among a plurality of terminal points provided on one plane in a route passing an area on said plane other than an area where wiring is prohibited, comprising;

monitoring side generating means for generating a virtual side for monitoring wiring density between any two of said terminal points on said plane while avoiding said wiring prohibiting areas, and wiring design means for designing wiring routes connecting said terminal points based on the width of wiring crossing each of said monitoring side for monitoring wiring density, said wiring design means generates a wiring route according to a design rule at least indicating the space between said terminal points, the wiring density as defined by the proportion of the width of said wiring occupying the space between said terminal points, the space between said wiring, and the width of said wiring, said wiring design means further comprises;

candidate route generating means for successively searching the wiring routes according to said design rule for portions of each wiring route to define partial routes from a terminal point where said wiring starts to a terminal point where it terminates to generate one or more candidate routes, route length evaluating means for calculating the value of a route length evaluation of each of said candidate routes based on the length of each of said candidate routes generated and the wiring density of the monitoring side crossing each of said candidate routes, said value of route length evaluation becoming larger when the length of said candidate route is longer and when the width of wiring crossing said monitoring side is wider, route selecting means for selecting a candidate route having the lowest value of said calculated route length evaluation from among said generated candidate routes, and partial route connecting means for connecting said selected candidate route with at least one additional candidate route to design the wiring routes.

2. The wiring design apparatus of claim 1 in which said route length evaluating means calculates said value of route length evaluation by multiplying the route length of each of said candidate routes by a weighting coefficient which becomes larger when the wiring density of said monitoring side crossing each of said generated candidate routes is larger.

3. The wiring design apparatus of claim 1 in which;

said candidate route generating means generates said candidate route while allowing it to cross other wiring routes, said route length evaluating means calculates the value of the route length evaluation of said candidate route generated with crossing allowed, and said route selecting means changes another wiring route crossing said selected candidate route to a partial route which is so selected as to eliminate crossing.

4. A wiring design method for designing wiring which provides connections among a plurality of terminal points provided on one plane in a route passing an area on said plane other than an area where wiring is prohibited, comprising the steps of;

generating a virtual side for monitoring a wiring density between any two of said terminal points on said plane while avoiding said wiring prohibiting areas, successively searching wiring routes according to a design rule at least indicating a space between said terminal points and a wiring density as defined by the proportion of the width of said wiring occupying the space between said terminal points for portions of each wiring route to define partial routes from a terminal point where said wiring starts to a terminal point where it terminates to generate one or more candidate routes, calculating the value of a route length evaluation of each of said candidate routes based on the length of each of said candidate routes generated and the wiring density of the monitoring side crossing each of said candidate routes, said value of route length evaluation becoming larger when the length of said candidate route is longer and when the width of wiring crossing said monitoring side is wider, selecting a candidate route having the lowest value of said calculated route length evaluation from among said generated candidate routes, and connecting said selected candidate route to at least one additional candidate route to design the wiring routes.

5. A recording medium recording a program for designing wiring which provides connections among a plurality of terminal points provided on one plane in a route passing an area on said plane other than an area where wiring is prohibited, comprising;

monitoring side generating step for generating a virtual side for monitoring wiring density between any two of said terminal points on said plane while avoiding said wiring prohibiting areas, and wiring design step for designing wiring routes connecting said terminal points based on the width of wiring crossing each of said monitoring side for monitoring wiring density,said wiring design step generates a wiring route according to a design rule at least indicating the space between said terminal points, the wiring density defined by the proportion of the width of said wiring occupying the space between said terminal points, the space between said wiring, and the width of said wiring, wherein said wiring design step executes;

candidate route generating process for successively searching the wiring routes according to said design rule for portions of each wiring route to define partial routes from a terminal point where said wiring starts to a terminal point where it terminates to generate one or more candidate routes, route length evaluating process for calculating the value of a route length evaluation of each of said candidate routes based on the length of each of said candidate routes generated and the wiring density of the monitoring side crossing each of said candidate routes, said value of route length evaluation becoming larger when the length of said candidate route is longer and when the width of wiring crossing said monitoring side is wider, route selecting process for selecting a candidate route having the lowest value of said calculated route length evaluation from among said generated candidate routes, and partial route connecting process for connecting said selected candidate route with at least one additional candidate route to design the wiring routes.

6. The recording medium of claim 5 in which said route length evaluating step executes a process of calculating said value of route length evaluation by multiplying the route length of each of said candidate routes by a weighting coefficient which becomes larger when the wiring density of said monitoring side crossing each of said generated candidate routes is larger.

7. The recording medium of claim 5 in which;

said candidate route generating step executes a process of generating said candidate route while allowing it to cross other wiring routes, said route length evaluating step executes a process of calculating the value of the route length evaluation of said candidate route generated with crossing allowed, and said route selecting step executes a process of changing another wiring route crossing said selected candidate route to a partial route which is so selected as to eliminate crossing.

* * * * *